(12) United States Patent
Mengel

(10) Patent No.: US 7,598,622 B2
(45) Date of Patent: Oct. 6, 2009

(54) ENCAPSULATION OF A CHIP MODULE

(75) Inventor: Manfred Mengel, Bad Abbach (DE)

(73) Assignee: Infineon Technologies AG (DE)

( * ) Notice: Subject to any disclaimer, the term of this patent is extended or adjusted under 35 U.S.C. 154(b) by 116 days.

(21) Appl. No.: 11/531,135

(22) Filed: Sep. 12, 2006

(65) Prior Publication Data

US 2007/0085225 A1 Apr. 19, 2007

(30) Foreign Application Priority Data

Sep. 13, 2005 (DE) .................. 10 2005 043 657

(51) Int. Cl.
*H01L 23/28* (2006.01)
*H01L 29/06* (2006.01)

(52) U.S. Cl. .................. 257/787; 257/783; 257/784; 257/618; 257/619; 257/E23.123

(58) Field of Classification Search .................. 257/787, 257/784, 618, 619, 783, E23.123
See application file for complete search history.

(56) References Cited

U.S. PATENT DOCUMENTS

| | | | |
|---|---|---|---|
| 5,968,849 A * | 10/1999 | Bello et al. .................. 438/747 |
| 5,990,553 A * | 11/1999 | Morita et al. ................ 257/729 |
| 6,528,879 B2 * | 3/2003 | Sakamoto et al. ............ 257/729 |
| 6,827,657 B2 * | 12/2004 | Sullivan ...................... 473/374 |
| 2002/0195685 A1 * | 12/2002 | Fjelstad et al. ............... 257/619 |
| 2003/0010970 A1 * | 1/2003 | Hara et al. ...................... 257/9 |
| 2006/0022356 A1 * | 2/2006 | Uwada et al. ................ 257/787 |

FOREIGN PATENT DOCUMENTS

EP   1 32 1480 A2   6/2003

* cited by examiner

*Primary Examiner*—Nitin Parekh
(74) *Attorney, Agent, or Firm*—Dickstein, Shapiro, LLP.

(57) ABSTRACT

A chip module with a substrate having a top side, a chip mounted on the top side of the substrate, and an encapsulation includes an encapsulation material. The encapsulation is applied on the chip and the top side of the substrate in such a way that the chip and the top side of the substrate are at least partly covered. The encapsulation material includes a polymer composition having at least a first polymer component and a second polymer component which are chemically covalently bonded by means of a crosslinker, the first polymer component imparting resistance toward a first class of chemically reactive compounds and the second polymer component imparting resistance toward a second class of chemically reactive compounds, the reactivities differing between the first and second classes of chemically reactive compounds.

27 Claims, 2 Drawing Sheets

ENCAPSULATION OF A CHIP MODULE

CROSS-REFERENCE TO RELATED APPLICATIONS

This application claims priority to German Patent Application Serial No. 102005043657.9, which was filed Sep. 13, 2005, and is incorporated herein by reference in its entirety.

FIELD OF THE INVENTION

The invention relates to an encapsulated chip module, a method for producing an encapsulated chip module and the use of an encapsulation material for forming an encapsulated chip module.

BACKGROUND OF THE INVENTION

Smart cards, whether they are contactless and/or comprise contacts, are used inter alia in cashless payment transactions or as access authorization. The smart cards usually comprise a chip module having a chip. The latter is used in the above-mentioned case for storing and/or processing the confidential or monetary data. The chip is mounted on a substrate and is usually encapsulated in order to protect the contact-connection and the chip itself against mechanical loading.

Smart cards are often subjected to attacks in order to read out or manipulate the data stored in the chip. The aim of the attacks may also be to determine the chip design for clones. Another conceivable aim of the attack is to use the chip improperly in some other way.

An attack may aim to strip away the chip encapsulation in such a way that the chip is exposed as far as possible without being destroyed and such that it still functions electrically. The unprotected chip can be examined by physical attacks during its operation with regard to its method of functioning and with regard to the stored data. The physical attacks comprise so-called "probing", in the case of which the signals of the chip are tapped off and evaluated. In the case of so-called "forcing", the interconnects of the chip are rewired at the microscopic level in order to manipulate the functional sequence of the chip.

On the part of the electrical industry, particularly in the area of pay tv and cashless payment transactions, there is a great interest in preventing attacks on the corresponding chips. Manipulation of the semiconductor chips used for decrypting the pay tv programs transmitted with encryption means that the companies incur high financial losses.

A further area that is particularly affected by smart card manipulations is the credit and cash card sector. The improper manipulation of credit cards or cash cards means that the affected companies or the card holders incur financial damage.

A further area of application in which the smart cards have to be protected against manipulation is the storage of security-relevant or sensitive data, for example in smart cards used as access authorization, electronic passports or patient cards containing data about the medical history.

Conventional encapsulation materials are resistant toward attacks of one specific class of chemical attack, for example to acid attacks or to attacks with bases. With knowledge of the encapsulation material, the encapsulation can be removed in a simple manner by means of wet-chemical attack of an appropriate class of attack that aims to decompose the encapsulation.

Further developments relate to an encapsulation in which a plurality of protective layers are applied to the chip surface. Each of the protective layers affords a limited protection only against one specific class of attack. By analyzing the respective protective layer and using a suitable attack material, encapsulation can be removed layer by layer by selecting a suitable chemical for the wet-chemical attack depending on the layer material.

The use of a completely chemically resistant protective material, for example a glass material, such as borosilicate, or a ceramic, is not possible on account of the high processing temperatures, which would lead to destruction of the chip. What is more, these materials have an unmatched coefficient of thermal expansion and also excessively high modulus of elasticity values, which would lead to the destruction of the chip during operation. Moreover, it is not possible to achieve a sufficient adhesion of these materials on the chip, so that the encapsulation can be lifted off relatively simply from the chip by means of mechanical attacks.

BRIEF DESCRIPTION OF THE DRAWINGS

The invention is explained below on the basis of exemplary embodiments with reference to the drawing.

DETAILED DESCRIPTION OF THE INVENTION

Figure 1:
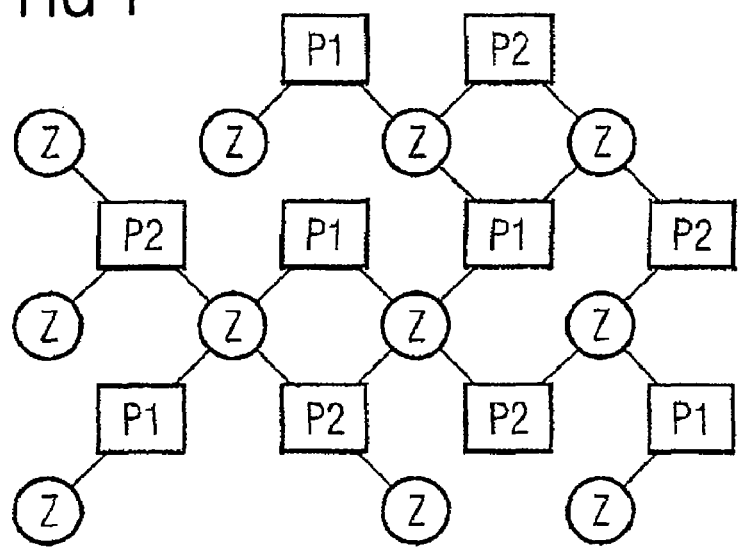
FIG. 1 shows a two-dimensional excerpt from a thermosetting network of a polymer composition.

FIG. 1 shows a two-dimensional excerpt from a thermosetting network of a polymer composition. The network comprises basic structural units of a first polymer type P1 and basic structural units of a second polymer type P2, which are linked to form a network by means of central linking units Z. It is also conceivable for basic structural units of even further polymer types to be provided. The polymer components P1 and P2 are coordinated in such a way that each polymer component affords protection with respect to a different class of chemical attack. Conceivable chemical attacks include for example acid attacks or base attacks or attacks by solvents. It is also conceivable, of course, to choose polymer types which largely impart resistance to the same class of attack but are nevertheless coordinated in such a way that the polymer composition affords more protection against attacks of this class than only one of the polymer types.

The polymer composition described above may also be referred to as a copolymer, it being conceivable for the different components in part also to be directly linked to one another.

The polymer composition comprises basic structural units of at least two different polymer components that are bonded to one another in network-spanning fashion. This results in an encapsulation material which affords a virtually universal wet-chemical resistance toward the attacks of different classes of chemically reactive compounds. Furthermore, the polymer composition is thermosetting and multiblock-like.

During an attack with a class of chemically reactive compounds, the overall polymer matrix remains virtually undamaged since only one of the polymer components, which is arranged in that surface of the polymer matrix which is directly exposed to the attack, is destroyed. Enough intact polymer chains of the polymer component that is resistant toward this class of attack still remain, which ensure the stability of the network and protect the polymer components arranged beneath the surface against wet-chemical attack. Therefore, only the topmost layer can be thinly removed.

It is only by means of alternate attacks of two different classes, for example acid and base attacks, that the encapsulation material can be removed layer by layer in a complicated manner. Without intermediate rinsing, chip-destroying local heating would occur during the chemical neutralization process. Chip damage can occur as a result of temperature differences during the intermediate rinsings. High temperatures are in each case required for resolving the encapsulation layer. In view of this complexity, it is virtually impossible for the encapsulation to be chemically decomposed without the chip being damaged in the process.

The incorporated polymer components may comprise a chemical basis of epoxides, polyimides, silicones or fluoropolymers. By way of example, it is conceivable to use an epoxide polymer as components resistant toward base attacks and to use a polyimide polymer, for example bismaleimide, as components resistant toward acid attacks. The two components of epoxide and polyimide may be linked for example by means of a phenolic curing agent as central linking unit.

The first component and the second component are preferably chosen in an at least almost balanced weight ratio relative to one another in order to enable similarly good protection both against the first and against the second class of attack.

Besides the thermosetting polymer, in one advantageous development the encapsulation material comprises a filler material that is usually largely resistant toward wet-chemical attacks. The filler material is incorporated into the polymer matrix. The filler material may be of inorganic or organic nature or a mixture of both. Examples of an inorganic filler material are, for example, a chemically resistant quartz material which may comprise a proportion of up to 90 per cent by weight or volume of the encapsulation material and is added to the polymer matrix. The encapsulation material preferably comprises a filler proportion in the range of between 60% and 90%, in particular between 80% and 90%. A fluorocarbon-based filler, such as Teflon for example, is also conceivable.

Through the choice of the filler and its proportion in the encapsulation material, it is possible to adjust the properties of the encapsulation material with regard to the requirements. By way of example, it is thereby possible to adapt the coefficient of thermal expansion to the component to be encapsulated, and also to influence the processability, the resistance to moisture and the adhesion.

The properties of the encapsulation material can be influenced further by the incorporation of various additives. By way of example, a very good thermal stability is obtained by incorporating specific aromatic imides into the polymer matrix.

Figure 2:
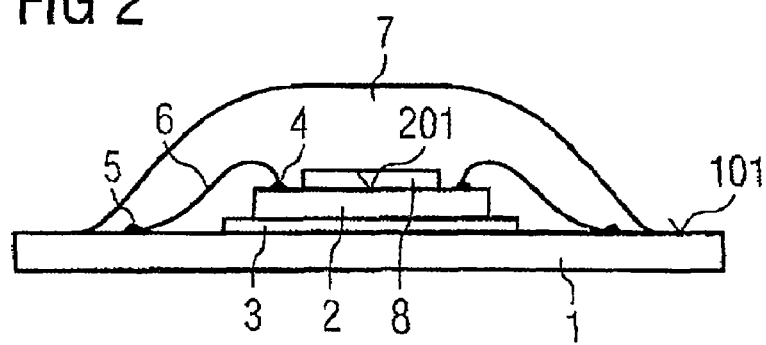
FIG. 2 shows a first exemplary embodiment of a chip module.

FIG. 2 shows an exemplary embodiment of the chip module according to the invention. The chip module comprises a substrate 1, on which a chip 2 is arranged. The chip 2 is fixed on a top side 101 of the substrate 1 by means of a chip adhesive 3. Contact locations 4 arranged on a top side 201 of the chip 2 are connected to connection regions 5 on the substrate via bonding wires 6. An encapsulation 7 covering the chip 2 and the bonding wires 6 and comprising the encapsulation material described above is applied on the chip 2 and that region of the substrate top side 101 which is adjacent thereto. Lines or interconnects which run on the top side of the chip 2, if appropriate, are covered by a passivation layer 8. The passivation layer 8 serves for protecting the interconnects on the chip top side 201 against mechanical actions and covert visual observation. The passivation layer 8 is usually formed from polyimide.

The substrate may be formed from nonconductive material or as a leadframe made of metal. The encapsulation may also encompass the entire substrate or additional regions on the substrate undersides.

An attack against the first exemplary embodiment might comprise destroying the polyamide layer 8 by undercutting, without the chip 2 being damaged in the process. However, this necessitates gaining access to the passivation layer 8, for example by grinding away the encapsulation 7 laterally with respect to the chip 2. The encapsulation is resistant toward the subsequent undercutting. Only the passivation layer 8 is destroyed. However, since the encapsulation 7 does not touch the chip 2 or touches only a small region of the chip 2, the encapsulation could easily be lifted off after undercutting, without the chip being damaged, with the result that the chip 2 would be exposed. In this case, the top side 201 of the chip 2 and the interconnects arranged thereon would be accessible for a physical attack for covert observation of the chip construction, the chip function or the stored data.

In the further exemplary embodiments illustrated, identical reference symbols specify identical arrangement parts. In order to avoid repetition, corresponding arrangements will not be described repeatedly.

Figure 3:
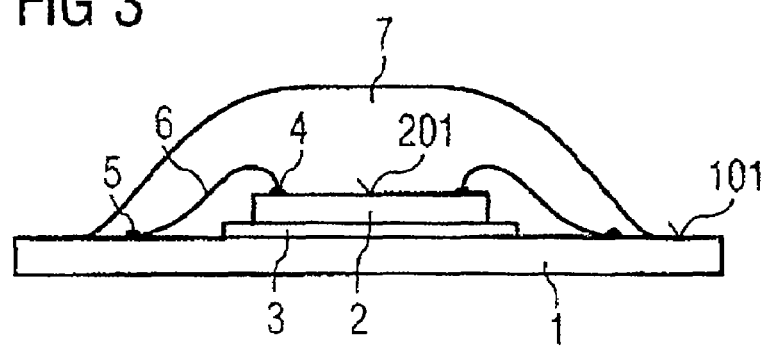
FIG. 3 shows a second exemplary embodiment of the chip module.

FIG. 3 shows a second exemplary embodiment, which differs from the first exemplary embodiment by virtue of the fact that no passivation layer is provided on the top side 201 of the chip 2. The encapsulation 7 directly touches the patterned, electrically active chip top side 201 and, if appropriate, the interconnects arranged thereon in a region having the largest possible area. Undercutting thus becomes impossible. Wet-chemical attacks would lead to the destruction of the chip top side 201. In this embodiment, the interconnects advantageously comprise aluminum or an aluminum alloy.

The first and second exemplary embodiments, and also the subsequent exemplary embodiments, are virtually resistant toward wet-chemical attacks with use of the above-described encapsulation material for encapsulation. It would nevertheless be possible to uncover the chip 2 by a process of grinding away in such a way that the chip 2 is still functional. In this case, the encapsulation 7 and, if appropriate, also the polyamide layer 8 are ground away down to the top side 201 of the chip 2.

The protective effect for the first and second exemplary embodiments and also the exemplary embodiments still to follow can additionally be reinforced by configuring the chip 2 to be as thin as possible. In the case of an extremely thin chip configuration, the chip thickness is less than 100 µm, advantageously less than 80 µm, and here preferably less than 60 µm. Such a thin chip makes it virtually impossible to effect the targeted grinding away or chemical decomposition of the encapsulation 7 without the chip 2 being destroyed in the process, since the effect of the attack would have to be adjusted very precisely.

Figure 4:
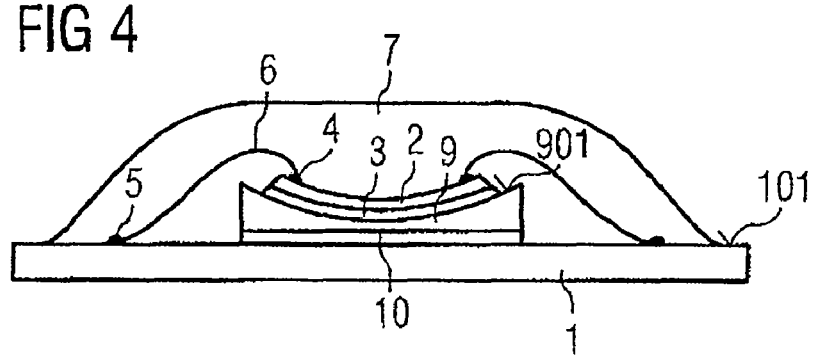
FIG. 4 shows a third exemplary embodiment of the chip module.

FIG. 4 illustrates a third exemplary embodiment. This exemplary embodiment comprises a substrate 1, on the top side 101 of which a chip carrier 9 is fixed by means of an adhesive layer 10. The chip carrier 9 has a curved top side 901. The chip 2 is adhesively bonded onto the curved top side 901 of the chip carrier 9 in such a way that its form follows the curved top side 901 of the chip carrier 9. Bonding wires 6 connect connection locations 4 of the chip 2 and connection regions 5 on the substrate 1. An encapsulation 7 covers the contact-connected chip 2.

The top side of the chip carrier 9 is curved by way of example in such a way that the chip adhesively bonded therein is bent away by its sides from the top side 101 of the substrate 1. Instead of the concave curvature, the top side of the chip carrier 9 may also be convexly curved, so that the side regions of the chip are bent toward the top side 101 of the substrate 1.

The curvature of the chip has the effect that grinding away is accompanied by the almost inevitable destruction of the chip 2. Since regions of the chip module are removed in planar fashion during the grinding away process, regions of the chip 2 arranged in curved fashion which originally project beyond the ground-away plane are likewise ground away and destroyed, while other regions of the chip 2 are still covered by the encapsulation material.

The curved mounting of the chip 2 also makes it more difficult to effect targeted decomposition of the encapsulation material during a wet-chemical attack which is also performed layer by layer proceeding from the encapsulation surface. Consequently, regions of the curved chip 2 are already uncovered while others are still covered by the encapsulation material. In order to uncover the remaining covered chip regions without the chip regions that have already been uncovered being exposed to the wet-chemical attacks, a highly targeted application of the chemicals is required.

Figure 5:
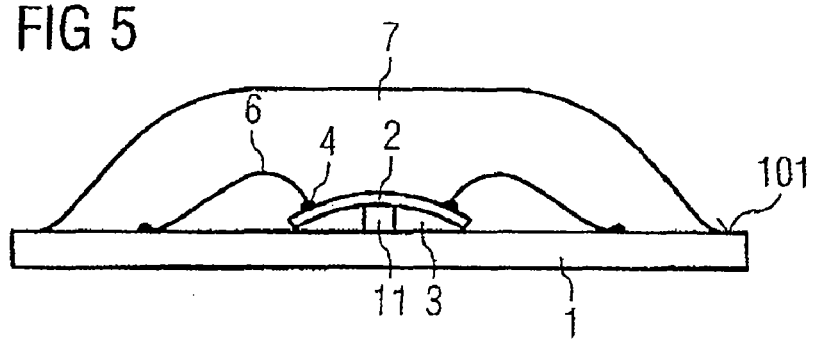
FIG. 5 shows a fourth exemplary embodiment of the chip module.

FIG. 5 shows a fourth exemplary embodiment having a chip 2 contact-connected by means of the bonding wires 6 on a substrate 1, which is covered by the encapsulation 7. The chip 2 is mounted on a chip carrier 11, which may be formed for example as a metallization line on the substrate top side 101. By means of an adhesive 3 that shrinks in the course of curing and is applied on both sides of the chip carrier 11 on the top side 101 of the substrate 1, the chip is tensioned into the curved form during the curing of the adhesive 3 since the chip 2 bears on the chip carrier 11 in its central region and the edge regions are tensioned in the direction of the substrate 1 by adhesive. That region between the chip 2 and the substrate 1 which is not occupied by the chip carrier 11 is filled by adhesive 3. Besides the shrinkage properties of the adhesive 3, the strain of the chip 2 can also be influenced by the amount and position of the applied adhesive.

Figure 6:
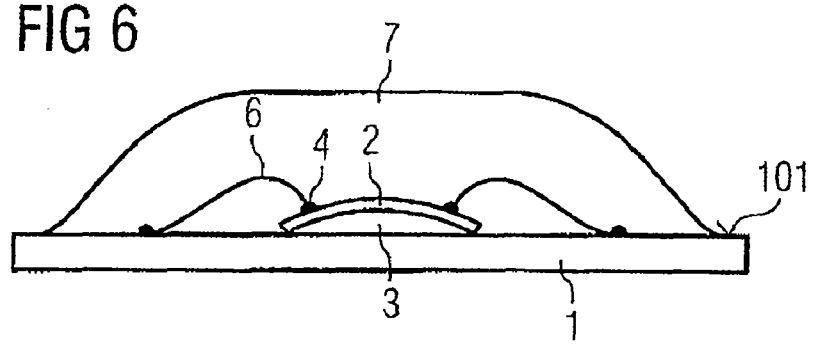
FIG. 6 shows a fifth exemplary embodiment of the chip module.

FIG. 6 shows a fifth exemplary embodiment, in which the curved form of the chip is achieved by virtue of the shrinkage during the curing of the chip adhesive 3 leading to the strain of the chip 2. The degree of strain can be influenced by the choice of material of the adhesive or the shrinkage behavior thereof and also the amount and position of the applied adhesive.

It should be noted that a greater deformation of the chip 2 can usually be achieved by the use of a chip carrier 9, 11 than by means of the shrinking adhesive alone.

Figure 7:
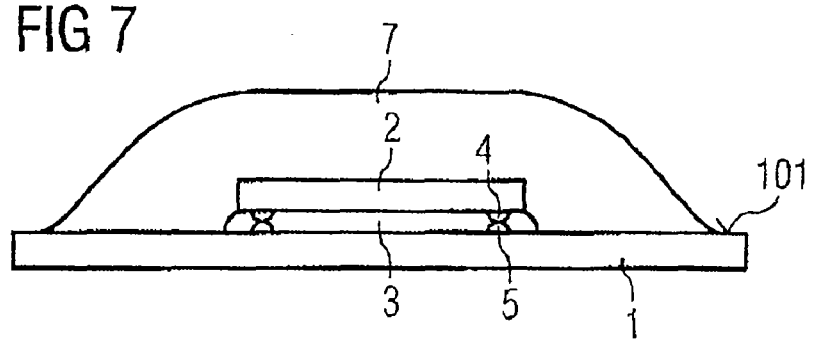
FIG. 7 shows a sixth exemplary embodiment of the chip module.

FIG. 7 shows a sixth exemplary embodiment, in which the chip is mounted on the substrate 1 using so-called flip-chip technology. The chip side with the connection locations 4 of the chip 2 is arranged facing the substrate top side 101. The connection locations 4 are contact-connected to the connection regions 5 on the chip 2 either directly or by means of interposed contact-connection elements or conductive soldering or adhesive-bonding connections. In this case, too, an encapsulation 7 is applied over the contact-connected chip 2. It is also conceivable for the chip contact-connected using flip-chip technology to be mounted in curved fashion.

It is expressly pointed out at this juncture that the exemplary embodiments illustrated in FIGS. 2 to 7 can be combined with one another.

Suitable methods for applying the encapsulation composition to the already mounted chip include a molding pressure method or a dispensing method.

The molding pressure method is used to form so-called mold caps. The initially solid molding composition is liquefied by heating under pressure, applied to the contact-connected chip and immediately cured.

Dispensing is suitable for forming so-called globe top encapsulations. In this case, the viscous encapsulation material is applied to the chip through a dispensing needle by means of compressed air. The two methods differ with regard to their processing and the consistency of the encapsulation material used. These properties of the encapsulation material can be adapted to the requirements of the application method by suitable choice of, in particular, the fillers and the additives.

In both methods, it is possible to direct the flow direction of the encapsulation material through a frame arranged around the chip 2.

The chip module is virtually resistant toward wet-chemical attacks in order to prevent the improper use of the smart card chip. During a wet-chemical attack, the encapsulation does not decompose or can only be destroyed in such a way that the chip surface is also partly or wholly destroyed in the process. After the chip has been exposed, it thereby become unusable for the attacker.

In one advantageous configuration of the invention, the classes of attack comprise attacks by acids or attacks by bases or attacks by solvent, so that the polymer composition is suited to being largely resistant toward a wide range of wet-chemical attacks which encompasses at least two different classes of attack.

In one advantageous configuration of the invention, the polymer composition is formed in network-spanning fashion and in multiblock-like fashion in order that the stability of the encapsulation material is preserved even after a wet-chemical attack in which one of the polymer components has been decomposed only at the encapsulation surface.

In one advantageous configuration of the invention, the polymer composition is formed in thermosetting fashion in order that the encapsulation material protects the chip and its contact-connections sufficiently against mechanical and thermal influences.

In one advantageous configuration of the invention, the encapsulation material comprises, besides the polymer composition, a filler comprising fluorocarbons, for example. Through the choice of a suitable filler, the encapsulation material is adapted to the components of the chip module, in particular the chip and the substrate, with regard to the coefficient of thermal expansion and is controlled with regard to its flow properties.

In one advantageous development of the chip module, the chip is configured to be extremely thin in order to ensure that a mechanical action for removing the protective layer, by itself or in combination with a wet-chemical attack, easily destroys the chip and thus makes it unusable for the attacker.

In one advantageous configuration, the chip is mounted in curved fashion in order to ensure that complete or partial mechanical grinding away of the encapsulation is accompanied by destruction of the chip.

The curvature may be achieved by means of a curved chip carrier material or a chip carrier that predefines the curvature of the chip by means of its form. In the latter case, the chip is fixed on the chip carrier in curved fashion by means of an adhesive. As an alternative or in addition, the curved form may be achieved by the shrinkage during the curing of the chip adhesive and also the type and amount of the chip adhesive application. From the multiplicity of possibilities for mounting the chip in curved fashion, the person skilled in the art can select a suitable one depending on the desired outlay and degree of curvature.

In one advantageous configuration, the encapsulation material touches the chip surface. This averts attacks aimed at destroying a protective layer—present in conventional chip modules—between the chip and the encapsulation by means of so-called undercutting in order to lift off the encapsulation from the chip.

In one advantageous configuration of the invention, the encapsulation is formed by applying a covering composition or an encapsulation material to the already mounted and contact-connected chip. The encapsulation may be formed as a so-called globe top, which is applied by dispensing, or may be a so-called mold cap, which is formed by the application of a molding composition under high pressure.

With regard to the method, an advantage of one configuration of the invention is that the chip module produced thereby is resistant toward virtually every type of wet-chemical attacks.

By coordinating the polymer components in the polymer composition, it is possible to adjust and optimize the protection with respect to a specific type of wet-chemical attacks or specific combinations of wet-chemical attacks.

By means of a suitably chosen filler material, which may be of an inorganic or organic type and may comprise a fluorocarbon, for example, and which is incorporated into the polymer matrix, the resulting encapsulation material can be adapted flexibly with regard to important and customary quality criteria, such as the coefficient of expansion, thermal stability, moisture resistance and adhesion, to the requirements made of the finished chip module and the processability.

In one advantageous configuration of the invention, the encapsulation is applied directly to the chip, which does not have a polyimide layer on its patterned, electrically active side. Consequently, attacks by undercutting are not possible.

In one advantageous configuration, the chip is mounted onto the top side of the substrate in curved fashion in order that the resulting chip module is also resistant toward mechanical grinding away. This perfects the scope of protection against a wide variety of attacks.

Suitable steps for mounting the chip in curved fashion comprise adhesively bonding the chip into a correspondingly curved receptacle area of a chip carrier, or compelling its deformation by means of a chip adhesive that shrinks in the course of curing. The former method enables the degree of curvature to be adjusted exactly; the latter method is simple to realize since the curvature is accompanied by the adhesive-bonding mounting of the chip.

In one advantageous configuration, the encapsulation is formed as a mold cap by the application of a molding composition under pressure.

As an alternative, it is also conceivable for the encapsulation to be applied by dispensing in order to form a globe top encapsulation. This opens up to the person skilled in the art alternatives in the selection of a suitable fabrication process for applying the encapsulation.

The encapsulation material is used for forming an encapsulation of a chip mounted on a top side of a substrate, the encapsulation being resistant toward wet-chemical attacks, the encapsulation material comprising a polymer composition having at least a first polymer component and a second polymer component which are chemically covalently bonded by means of a crosslinker, the first polymer component imparting resistance toward a first class of chemically reactive compounds and the second polymer component imparting resistance toward a second class of chemically reactive compounds, the reactivities differing between the first and second classes of chemically reactive compounds.

This use has the advantage of thereby obtaining protection against a variety of wet-chemical attacks in a simple and cost-effective manner.

The invention claimed is:

1. A chip module comprising:
   a substrate having a top side;
   a chip carrier mounted on the substrate top side and having a side that is curved;
   a curved chip mounted on the curved side of the chip carrier; and
   an encapsulation comprising an encapsulation material, which encapsulation is applied on the chip and the top side of the substrate such that the chip and the top side of the substrate are at least partly covered,
   wherein the encapsulation material comprises a polymer composition having at least a first polymer component and a second polymer component which are chemically covalently bonded by means of a crosslinker, the first polymer component imparting resistance toward a first class of chemical attacks by chemically reactive compounds and the second polymer component imparting resistance toward a second class of chemical attacks by chemically reactive compounds, and
   wherein the respective chemically reactive compounds of the first and second classes of chemical attacks each have differing reactivities with the first and second polymer components.

2. The chip module as claimed in claim 1, wherein the respective chemically reactive compounds of the first class of chemical attacks is selected from the group consisting of acids, bases and solvents, and the respective chemically reactive compounds of the second class of chemical attacks is selected from the group consisting of acids, bases and solvents.

3. The chip module as claimed in claim 1, wherein basic structural units of at least the first polymer component is bonded with basic structural units of the second polymer component to form a polymer composition which is network-spanning and/or multiblock-like.

4. The chip module as claimed in claim 3 wherein the polymer composition is thermosetting.

5. The chip module as claimed in claim 1, wherein the polymer components comprise one of the materials selected from the group consisting of epoxides, polyimides, silicones and fluoropolymers.

6. The chip module as claimed in claim 1, wherein the encapsulation material comprises an inorganic and/or an organic filler material that is incorporated into the polymer matrix.

7. The chip module as claimed in claim 1, wherein the encapsulation material comprises one a material selected from the group consisting of aromatic imides and fluorocarbons.

8. The chip module as claimed in claim 1, further comprising an adhesive arranged between the chip and the substrate top side fixing the chip.

9. The chip module as claimed in claim 1, wherein the encapsulation touches an areal surface region of the chip.

10. The chip module as claimed in claim 1, wherein the chip thickness is less than 100 micrometers.

11. The chip module as claimed in claim 1, wherein the encapsulation is formed as a mold cap or as a globe top.

12. The chip module as claimed in claim 1, further comprising a passivation layer mounted on the top side of the chip.

13. The chip module as claimed in claim 1, wherein the chip is mounted on the substrate using flip-chip technology.

14. The chip module as claimed in claim 1, wherein the respective chemically reactive compounds of the first class of chemical attacks and the second class of chemical attacks are acids and bases respectively.

15. The chip module as claimed in claim 1, wherein the first polymer component comprises an epoxide polymer.

16. The chip module as claimed in claim 1, wherein the second polymer comprises a polyimide polymer.

17. A chip module comprising:

a substrate having a substrate top side;

a chip carrier mounted on the substrate top side and having a side that is curved;

a curved chip having a chip top side and a chip underside, the chip underside facing the curved side of the chip carrier; and an encapsulation, which comprises an encapsulation material, applied to at least one region of the chip top side and to at least one region of the substrate top side, wherein the encapsulation material comprises a network-spanning polymer composition having at least a first polymer component and a second polymer component which are chemically covalently bonded by means of a crosslinker, the first polymer component imparting resistance toward a first class of chemical attacks by chemically reactive compounds and the second polymer component imparting resistance toward a second class of chemical attacks by chemically reactive compounds, and wherein the respective chemically reactive compounds of the first and second classes of chemical attacks each have differing reactivities with the first and second polymer components.

18. The chip module as claimed in claim 17, wherein the curved side of the chip carrier is a top side, and wherein the chip underside is mounted on the curved top side of the chip carrier.

19. The chip module as claimed in claim 17, further comprising an adhesive arranged between the chip and the substrate top side fixing the chip.

20. The chip module as claimed in claim 17, wherein the polymer composition is thermosetting and/or multiblock-like.

21. The chip module as claimed in claim 17, wherein the encapsulation material comprises an inorganic and/or an organic filler material that is incorporated into the polymer matrix.

22. The chip module as claimed in claim 17, further comprising a chip carrier formed as a metallization line mounted on the substrate top side, wherein the chip underside is mounted on the top side of the chip carrier.

23. The chip module as claimed in claim 17, wherein the chip is curved such that its sides are bent away from the top side of the substrate.

24. The chip module as claimed in claim 17, wherein the chip is curved such that its sides are bent toward the top side of the substrate.

25. The chip module as claimed in claim 17, wherein the respective chemically reactive compounds of the first class of chemical attacks and the second class of chemical attacks are acids and bases respectively.

26. The chip module as claimed in claim 17, wherein the first polymer component comprises an epoxide polymer.

27. The chip module as claimed in claim 17, wherein the second polymer comprises a polyimide polymer.

* * * * *